(12) United States Patent
Yao et al.

(10) Patent No.: US 10,896,936 B2
(45) Date of Patent: Jan. 19, 2021

(54) DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Gu Yao, Beijing (CN); Qinghua Zou, Beijing (CN); Ruhui Zhu, Beijing (CN); Yu Wang, Beijing (CN); Tingyuan Duan, Beijing (CN)

(73) Assignees: HEFEI XINSHENG OPTOELECTRONICS TECHNOLOGY CO., LTD., Anhui (CN); BOE TECHNOLOGY GROUP CO.. LTD., Beijing (CN)

( * ) Notice: Subject to any disclaimer, the term of this patent is extended or adjusted under 35 U.S.C. 154(b) by 0 days.

(21) Appl. No.: 16/454,676

(22) Filed: Jun. 27, 2019

(65) Prior Publication Data

US 2020/0035763 A1 Jan. 30, 2020

(30) Foreign Application Priority Data

Jul. 26, 2018 (CN) .......................... 2018 1 0835978

(51) Int. Cl.
*H01L 27/32* (2006.01)
*G09G 3/3208* (2016.01)

(52) U.S. Cl.
CPC ....... *H01L 27/3225* (2013.01); *G09G 3/3208* (2013.01)

(58) Field of Classification Search
CPC ........ H01L 2251/5338; H01L 27/3225; G09G 3/3208
See application file for complete search history.

(56) References Cited

U.S. PATENT DOCUMENTS

| | | | |
|---|---|---|---|
| 2018/0261921 A1* | 9/2018 | Ha | ............................ H01Q 5/35 |
| 2019/0014402 A1* | 1/2019 | Ahn | .................... H01L 51/5253 |

FOREIGN PATENT DOCUMENTS

| | | |
|---|---|---|
| CN | 102387453 A | 3/2012 |
| CN | 202738101 U | 2/2013 |
| CN | 105373193 A | 3/2016 |

OTHER PUBLICATIONS

Office action dated May 6, 2020 for application No. CN201810835978.8 with English translation attached.

* cited by examiner

*Primary Examiner* — Charles V Hicks
(74) *Attorney, Agent, or Firm* — Nath, Goldberg & Meyer; Joshua B. Goldberg

(57) ABSTRACT

A display apparatus is provided. The display apparatus includes a display screen with two opposite surfaces, at least one of the two opposite surfaces is a display surface, a sounding structure is arranged at at least one side of the two opposite surfaces of the display screen, the sounding structure is configured to be deformed to sound under driving of sound signals, and the sound signals are electric signals applied to the sounding structure according to sounds to be made.

19 Claims, 6 Drawing Sheets

DISPLAY APPARATUS

CROSS REFERENCE TO RELATED APPLICATIONS

The present application claims the priority of the Chinese Patent Application with the Application No. 201810835978.8 filed Jul. 26, 2018, which is incorporated herein in their entirety by reference.

TECHNICAL FIELD

The present disclosure relates to the field of display technology, and in particular to a display apparatus.

BACKGROUND

An existing OLED (organic light-emitting diode) display apparatus is becoming a more popular product of the panel display.

SUMMARY

The present disclosure provides a display apparatus, including a display screen with two opposite surfaces, at least one of the two opposite surfaces being a display surface, wherein a sounding structure is arranged at at least one side of the two opposite surfaces of the display screen, the sounding structure is configured to be deformed to sound under driving of sound signals, and the sound signals are electric signals applied to the sounding structure according to sounds to be made.

In an embodiment of the present disclosure, the sounding structure includes a first conductive part and a second conductive part which are provided opposite to each other; the second conductive part is provided at a side of the first conductive part distal to the display screen; the first conductive part and the second conductive part are separated from each other, and supported and connected by at least one insulator; at least one of the first conductive part and the second conductive part is a flexible member; and the sound signals are applied to the first conductive part or the second conductive part.

In an embodiment of the present disclosure, the at least one insulator includes a plurality of insulators, which are located at edges of the first conductive part and the second conductive part; and/or located at a central region of the first conductive part and the second conductive part.

In an embodiment of the present disclosure, the insulator is made of an elastic material.

In an embodiment of the present disclosure, the first conductive part is attached to the display screen, and the first conductive part and the display screen are both flexible members; or the second conductive part is a flexible member; the flexible member has a curvature radius less than 1 cm, and a distance between the first conductive part and the second conductive part is in the range of 1~20 mm, and one of the first conductive part and the second conductive part is loaded with the sound signals, and the other is loaded with fixed signals.

In an embodiment of the present disclosure, the sound signals are voltage signals with a varying polarity; and the fixed signals are voltage signals with a fixed polarity.

In an embodiment of the present disclosure, the first conductive part is attached to the display screen, and the first conductive part, the display screen and the second conductive part are flexible members; one of the first conductive part and the second conductive part is loaded with the sound signals, the other is loaded with fixed signals; the flexible member loaded with the sound signals has a curvature radius less than 0.5 cm; the flexible member loaded with fixed signals has a curvature radius greater than 1 cm; and a distance between the first conductive part and the second conductive part is in the range of 10~20 mm.

In an embodiment of the present disclosure, the sound signals are voltage signals with a varying polarity; and the fixed signals are voltage signals with a fixed polarity.

In an embodiment of the present disclosure, the first conductive part includes a first base and a first conductive layer stacked on each other, and the first base is attached to the display screen; the second conductive part includes a second base and a second conductive layer stacked on each other, and the second conductive layer faces the first conductive layer; and signals loaded on the first conductive part are loaded on the first conductive layer; and signals loaded on the second conductive part are loaded on the second conductive layer.

In an embodiment of the present disclosure, the first conductive layer is loaded with the sound signals and the second conductive layer is loaded with the fixed signals, the first conductive layer has a resistance greater than 500 MΩ, and the first conductive layer has a thickness less than 50 μm, and the first base has a thickness less than 0.1 mm, or the second conductive layer is loaded with the sound signals and the first conductive layer is loaded with the fixed signals, the second conductive layer has a resistance greater than 500 MΩ, and the second conductive layer has a thickness less than 50 μm, and the second base has a thickness less than 0.1 mm.

In an embodiment of the present disclosure, the display apparatus further including: a plurality of separators which are located between the first conductive part and the second conductive part and are configured to support and connect the first conductive part and the second conductive part, wherein the first conductive layer is loaded with the sound signals and the second conductive layer is loaded with the fixed signals, the first conductive layer is divided into a conductive layer at a middle region and at least one conductive layer at an edge region by the plurality of separators, or the second conductive layer is loaded with the sound signals and the first conductive layer is loaded with the fixed signals, the second conductive layer is divided into a conductive layer at a middle region and at least one conductive layer at an edge region by the plurality of separators.

In an embodiment of the present disclosure, the conductive layer at the middle region includes a plurality of central conductive layers distributed in concentric rings, and two adjacent central conductive layers of the plurality of central conductive layers are separated and electrically insulated from each other; and each of the central conductive layers at the middle region is separately loaded with the sound signals.

In an embodiment of the present disclosure, the at least one conductive layer at the edge region includes a plurality of edge conductive layers distributed in concentric rings, and two adjacent edge conductive layers of the plurality of edge conductive layers are separated and electrically insulated from each other; and each of the edge conductive layers at the edge region is separately loaded with the sound signals, a diameter of an outermost concentric ring of the plurality of central conductive layers is at least twice greater than that of an outermost concentric ring of the plurality of edge conductive layers.

In an embodiment of the present disclosure, two sounding structures are respectively arranged at both sides of the two opposite surfaces of the display screen; the first conductive parts of the two surrounding structures and the display screen are flexible members, and the second conductive parts of the two surrounding structures are inflexible members, the display apparatus further includes: a driver configured to load the sound signals or the fixed signals on the first conductive parts and the second conductive parts via separated wires, wherein the polarity of voltage signals loaded on one of two first conductive parts and two second conductive parts is opposite to that voltage signals loaded on the other three; a controller configured to control the driver; and a processor configured to produce and send signals, corresponding to the sound that the display screen is intended to make, to the controller such that the controller controls the driver to change the polarity of the sound signals according to the received signals; wherein the processor is further configured to produce and send signals, corresponding to a case that the display screen does not make a sound, to the controller such that the controller controls the driver not to load the voltage signals on the first conductive parts and the second conductive parts according to the received signals.

In an embodiment of the present disclosure, two sounding structures are respectively arranged at both sides of the two opposite surfaces of the display screen; the first conductive parts of the two sounding structures and the display screen are flexible members, and the second conductive parts are inflexible members, the display apparatus further includes: a driver configured to load the voltage signals on the first conductive parts and the second conductive parts via separated wires, a controller configured to control the driver; and a processor configured to produce and send signals, corresponding to the sound that the display screen is intended to make, to the controller such that the controller controls the driver to change the polarities of voltage signals loaded on any one or any three of two first conductive parts and two second conductive parts according to the received signals; wherein the processor is further configured to produce and send signals, corresponding to a case that the display screen does not make a sound, to the controller such that the controller controls the driver not to load the voltage signals on the first conductive parts and the second conductive parts according to the received signals.

In an embodiment of the present disclosure, two sounding structures are respectively arranged at both sides of the two opposite surfaces of the display screen; the first conductive parts of the two sounding structures and the display screen are flexible members, and the second conductive parts are inflexible members, the display apparatus further includes: a driver configured to load the voltage signals on the first conductive parts and the second conductive parts via separated wires, a controller configured to control the driver; and a processor configured to produce and send signals, corresponding to the sound that the display screen is intended to make, to the controller such that the controller controls the driver to change magnitudes of the voltage signals loaded on any one, more than one or all of two first conductive parts and two second conductive parts according to the received signals; wherein the processor is further configured to produce and send signals corresponding to a case that the display screen does not make a sound, to the controller such that the controller controls the driver not to load the voltage signals on the first conductive parts and the second conductive parts according to the received signals.

In an embodiment of the present disclosure, the second conductive part is a flexible member, the display apparatus further includes: a driver configured to load the sound signals or the fixed signals on the first conductive part and the second conductive part via separated wires, a controller configured to control the driver; and a processor configured to produce and send signals, corresponding to the sound that the display screen is intended to make, to the controller such that the controller controls the driver to change the polarities of the sound signals loaded on the first conductive part or the second conductive part according to the received signals; wherein the processor is further configured to produce and send signals, corresponding to a case that the display screen does not make a sound, to the controller such that the controller controls the driver not to load the voltage signals on the first conductive part and the second conductive part according to the received signals.

In an embodiment of the present disclosure, the second conductive part is a flexible member, the display apparatus further includes: a driver configured to load the voltage signals on the first conductive part and the second conductive part via separated wires, a controller configured to control the driver; and a processor configured to produce and send signals, corresponding to the sound that the display screen is intended to make, to the controller such that the controller controls the driver to change magnitudes of the voltage signals loaded on the first conductive part or the second conductive part according to the received signals; wherein the processor is further configured to produce and send signals, corresponding to a case that the display screen does not make a sound, to the controller such that the controller controls the driver not to load the voltage signals on the first conductive part and the second conductive part according to the received signals.

In an embodiment of the present disclosure, the display apparatus further includes: a driver configured to load the sound signals with original magnitudes on the conductive layer at the middle region, load the sound signals with adjusted magnitudes on the at least one conductive layer at the edge region and load the fixed signals on conductive part loaded with the fixed signals via separated wires; a controller configured to control the driver; and a processor configured to produce and send signals, corresponding to the sound that the display screen is intended to make, to the controller such that the controller controls the driver to change the polarities of the sound signals according to the received signals; wherein the processor is further configured to produce and send signals, corresponding to a case that the display screen does not make a sound, to the controller such that the controller controls the driver not to load the voltage signals on the first conductive parts and the second conductive parts according to the received signals.

In an embodiment of the present disclosure, the display apparatus further includes: a driver configured to successively load the sound signals on the central conductive layers distributed in concentric rings at the middle region, from a ring with a minimum diameter to a ring with a maximum diameter, by a predetermined delay time, load the sound signals on the at least one conductive layer at the edge region and load the fixed signals on conductive parts loaded with the fixed signals, via separated wires; a controller configured to control the driver; and a processor configured to produce and send signals, corresponding to the sound that the display screen is intended to make, to the controller such that the controller controls the driver to change the polarities of the sound signals according to the received signals; wherein the processor is further configured to produce and send signals, corresponding to a case that the display screen does not make a sound, to the controller such that the controller controls the driver not to load the voltage signals on the first conductive parts and the second conductive parts according to the received signals.

DETAIL DESCRIPTION OF EMBODIMENTS

A display apparatus provided by the present disclosure will be further described in detail below in a combination with the drawings and the detail description of embodiments, causing a person skilled in the art to better understand the technical solution of the present disclosure.

A conventional OLED display apparatus sounds by a speaker during display, and the OLED display apparatus with the latest technology only has characteristics in regard to display of images, but still sounds by means of the conventional sounding technology, which restricts the OLED display technology from becoming more fashionable, more characteristic and more foresight, to a certain degree.

Thus, the present disclosure provides a display apparatus. An embodiment of the present disclosure provides a display apparatus including a display screen with two opposite surfaces, at least one of the two opposite surfaces is a display surface, a sounding structure is arranged at at least one side of the two opposite surfaces of the display screen, the sounding structure is configured to be deformed to sound under driving of sound signals, and the sound signals are electric signals applied to the sounding structure according to sounds to be made.

In the display apparatus, the sounding structure is provided at at least one side of both opposite surfaces of the display screen, such that the display apparatus can sound from the display screen in the case where the sounding structure is deformed to sound by the sound signals, such that the display apparatus does not need to be provided with speakers, reducing the volume of the display apparatus, expanding its application field and improving its added values, while causing the display apparatus to be more unique and fashionable.

Figure 1:
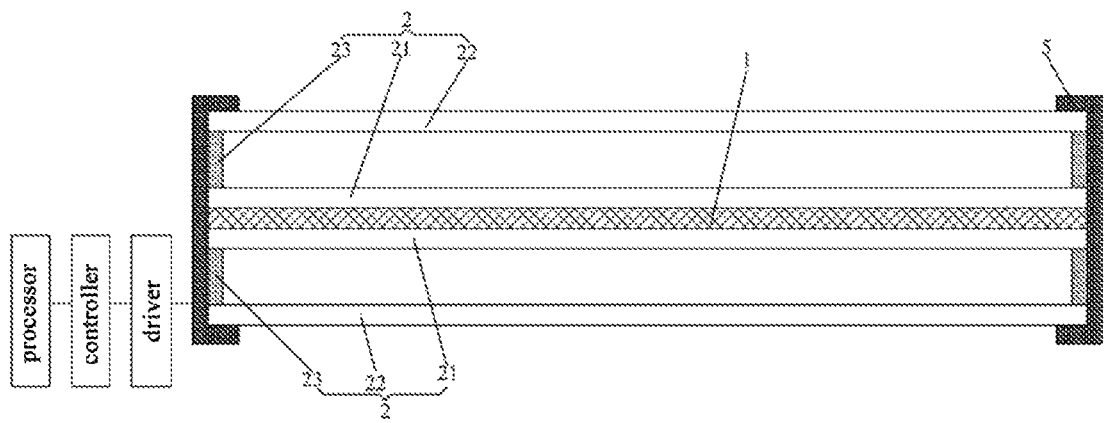
FIG. 1 is a schematic diagram of a structure of a display apparatus according to an embodiment of the present disclosure.

FIG. 1 is a schematic diagram of a structure of a display apparatus according to an embodiment of the present disclosure. In the embodiment, as shown in FIG. 1, the display apparatus includes a display panel, which includes a display screen 1 and two sounding structures 2 arranged on both opposite surfaces of the display screen 1.

In an embodiment of the present disclosure, as shown in FIG. 1, each sounding structure 2 includes a first conductive part 21 and a second conductive part 22 which are provided opposite to each other. The second conductive part 22 is provided at a side of the first conductive part 21 distal to the display screen 1. The first conductive part 21 and the second conductive part 22 of the sounding structure 2 are separated from each other, and supported and connected by insulators 23 at both sides. At least one of the first conductive part 21 and the second conductive part 22 of the sounding structure 2 is flexible. In an embodiment of the present disclosure, as shown in FIG. 1, the insulators 23 are provided such that the display screen 1 can move within a small region. At least one of the first conductive part 21 and the second conductive part 22 of the sounding structure 2 is flexible such that when sound signals drive the sounding structures 2, the flexible members (the at least one of the first conductive part 21 and the second conductive part which is flexible) can produce a deformation, and thus vibrate, thereby causing the sounding structures 2 to sound.

In an embodiment of the present disclosure, as shown in FIG. 1, the first conductive parts 21 are attached to the display screen 1, and are flexible with a curvature radius of less than 1 cm; and a distance between the first conductive part 21 and the second conductive part 22 of the sounding structure 2 is in the range of 1~20 mm. The curvature radius refers to a minimum radius of a circle formed by bending the display screen to be curled in the case where the normal display is ensured, for describing the flexible degree of the flexible member. One of the first conductive part 21 and the second conductive part 22 of the sounding structure 2 is loaded with sound signals, the other is loaded with fixed signals, which will be described referring to FIGS. 3A to 3D in detail. In an embodiment of the present disclosure, the sound signals are voltage signals with the varying polarity, which may change; and the fixed signals are voltage signals with the fixed polarity, which may be constant.

In an embodiment of the present disclosure, the thickness of the display screen 1 is less than 1 mm; the thickness of the first conductive parts 21 is less than 1 mm, which can cause the curvature radius of both the display screen 1 and the first conductive part 21 to be less than 1 cm. The thickness of the second conductive parts 22 is not limited herein.

In an embodiment of the present disclosure, the display screen 1 is a flexible OLED display screen. Both the display screen 1 and the first conductive parts 21 are the flexible members, such that as the first conductive parts 21 produce a deformation under the driving of sound signals, the display screen 1 attached to the first conductive parts 21 produces a deformation. The first conductive parts 21 can vibrate with respect to the second conductive parts 22 during the deformation, thereby causing the sounding structures 2 to sound. The parameters such as the curvature radius of the flexible members are set and the distance between the first conductive part 21 and the second conductive part 22 is set, such that not only the sounding structures 2 can sound and but also the sound from the sounding structures 2 has a better effect, improving experience when a user watches the videos.

As shown in FIG. 1, the display apparatus includes a processor, a controller and a driver. FIG. 1 only schematically shows a connection relationship among them.

In an embodiment of the present disclosure, the controller and the driver can be integrated circuits or chips independent of each other, or be integrated in one integrated circuit or chip. In an embodiment of the present disclosure, the driver can load voltage signals on each of the sounding structures 2 (each of the first conductive parts 21 and each of the second conductive parts 22) via separated wires (as shown in FIG. 1, which only schematically shows the connection between the driver and the display panel). In other embodiments of the present disclosure, the driver can load voltage signals on each of the sounding structures 2 (each of the first conductive parts 21 and each of the second conductive parts 22) by other means.

In an embodiment of the present disclosure, when the display screen is intended to sound, such as when a sound volume of the display screen is not zero or when there is a sound with the videos, the processor produces corresponding signals according to the sound (including tone, loudness and timbre) in the videos and sends the signals to the controller, such that the controller controls the driver to load voltage signals (for causing the sounding structure to sound) on each of the sounding structures 2 (each of the first conductive parts 21 and each of the second conductive parts 22) according to the received signals, such that the flexible members can produce a deformation, and thus vibrate, thereby causing the sounding structures 2 to sound.

In an embodiment of the present disclosure, when it is not desired to sound, such as when the sound volume of the display is zero or when there is no sound in the videos, the processor produces and sends corresponding signals to the controller, such that the controller controls the driver to load voltage signals (for causing the sounding structure to not sound) on each of the sounding structures 2 (each of the first conductive parts 21 and each of the second conductive parts 22) according to the received signals, such that the flexible members cannot produce a deformation, and thus do not vibrate, thereby causing the sounding structures 2 not to sound. In other embodiments of the present disclosure, when it is not desired to sound, the controller can control the driver not to load voltage signals on each of the sounding structures 2 (each of the first conductive parts 21 and each of the second conductive parts 22), which reduces the energy consumption.

In an embodiment of the present disclosure, voltage signals for causing the sounding structure to sound may be voltage signals for causing the sounding structure to sound, which are loaded between the first conductive part 21 and the second conductive part 22 of the sounding structure 2. For example, voltage signals for causing the sounding structure to sound may include voltage signals with the varying polarity loaded on one of the first conductive part 21 and the second conductive part 22 and voltage signals with the fixed polarity loaded on the other of the first conductive part 21 and the second conductive part 22.

In an embodiment of the present disclosure, voltage signals for causing the sounding structure not to sound may be voltage signals for causing the sounding structure not to sound loaded between the first conductive part 21 and the second conductive part 22 of the sounding structure 2. For example, voltage signals for causing the sounding structure not to sound may be voltage signals with the fixed polarity and the fixed magnitude loaded on the first conductive part 21 and the second conductive part 22. It is noted that the present disclosure includes but is not limited to above embodiments, and may further include other ways for causing the sounding structure not to sound or to sound.

In an embodiment of the present disclosure, greater the magnitude of the loaded voltage signals for causing the sounding structure to sound is, greater the sound intensity (the loudness) produced by the sounding structure is. In an embodiment of the present disclosure, the term "the varying polarity" refers to the polarity of the voltage signals loaded for causing the sounding structure to sound which is varying (that is, the polarity changes between the positive polarity and the negative polarity alternately); shorter the variation period is, higher the alternately varying frequency of the positive polarity and the negative polarity is, and thus, sharper the resulting sound is (or sharper the tone is).

In an embodiment of the present disclosure, when it is desired to provide different sound intensities, the processor produces and sends corresponding signals to the controller, such that the controller controls the driver to only change the magnitude of the voltage signals loaded on the first conductive parts 21 and/or the second conductive parts 22 according to the received signals. In an embodiment of the present disclosure, when it is desired to provide different tones, the processor produces and sends corresponding signals to the controller, such that the controller controls the driver to only change the changing frequency of the varying polarity of the voltage signals loaded on the first conductive parts 21 or the second conductive parts 22 according to the received signals.

It is noted that in other embodiments of the present disclosure, the first conductive parts 21 may be not attached to the display screen 1. For example, the first conductive parts 21 are connected with the display screen 1 at some points. That is, the display screen 1 is fixed to the first conductive parts 1 by a plurality of columnar supports at some points or the display screen 1 is attached to the first conductive parts 1 at some points. In this case, it is unnecessary for the display screen 1 to vibrate. Thus, the inflexible member may be used for the display screen 1.

Figure 2:
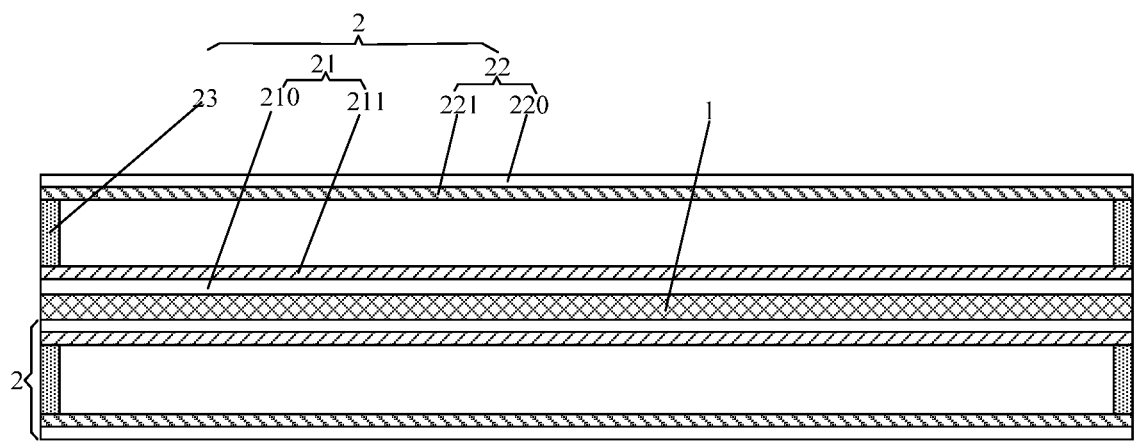
FIG. 2 is a schematic diagram of a structure of a sounding structure in the display apparatus according to an embodiment of the present disclosure.

FIG. 2 is a schematic diagram of a structure of a sounding structure in a display apparatus according to an embodiment of the present disclosure. In an embodiment of the present disclosure, as shown in FIG. 2, each of the first conductive parts 21 includes a first base 210 and a first conductive layer 211 stacked on each other, the first base 210 is attached to the display screen 1; each of the second conductive parts 22 includes a second base 220 and a second conductive layer 221 stacked on each other, the second conductive layer 221 faces the first conductive layer 211. In this way, the first conductive layer 211 and the second conductive layer 221 of each of the sounding structures 2 attract or repel each other when loaded with the electrical signals with the opposite or same polarities, such that forces for causing the flexible members to deform are produced on the flexible members, thereby causing the flexible members to vibrate and therefore sound.

In an embodiment of the present disclosure, the display screen 1 is an one-side OLED display screen, and the first conductive part 21 is provided on a display side of the display screen 1.

The first bases 210 are made of a PP, PET, PVC, PC or PI material, with a thickness of less than 0.1 mm. The first conductive layers 211 are made of a transparent amorphous oxide semiconductor such as $SnO_2$, IZO, ITO, GaN or GaAs, or IGZOT, with the thickness of less than 50 μm. The second bases 220 are made of a PP, PET, PVC, PC or PI material and may take a form of a printed circuit board (PCB); and the second conductive layers 221 are made of Ag, Mg, ITO, IZO or IGZO. The thickness of the second base 220 and the second conductive layers 221 is not limited herein.

In an embodiment of the present disclosure, the resistance of the first conductive layer 211 loaded with sound signals is greater than 500 MΩ, and the resistance of the second conductive layers 221 loaded with fixed signals is greater, which ensures that a small current is generated when the polarity is changed and which keeps an accumulation for surface charges well. In this way, the loaded voltage signals are well kept on the first conductive layers 211, such that the sounding structures 2 can make a more stable sound with a better sounding effect. In an embodiment of the present disclosure, the first conductive layers 211 are loaded with voltage signals with the varying polarity, and the second conductive layers 221 are loaded with voltage signals with the fixed polarity, such that forces with the varying direction for causing the flexible members to deform are produced on the flexible members, thereby causing the flexible members to vibrate and therefore sound.

It is noted that in an embodiment of the present disclosure, the first conductive layers 211 are loaded with voltage signals with the fixed polarity and the second conductive layers 221 are loaded with voltage signals with the varying polarity. In this case, the resistance of the second conductive layers 221 is greater than 500 MΩ, which also causes the sounding structures 2 to sound. In other embodiment of the present disclosure, other forms of loading voltage signals can be used, such that the sounding structures 2 are deformed to sound under the driving of the loaded voltage signals.

For example, as shown in FIG. 2, in the embodiment where the display screen 1 and the first conductive parts 21 are flexible members and the second conductive parts 22 are inflexible members, the polarity of voltage signals loaded on one of two first conductive layers 211 and two second conductive layers 221 provided respectively on both opposite surfaces of the display screen 1 is necessarily different from the polarities of voltage signals loaded on the other three, such that when the polarities of voltage signals loaded on two first conductive layers 211 or two second conductive layers 221 loaded with voltage signals with the varying polarity are changed, the forces with the varying direction will be exerted on the flexible display screen 1 and first conductive parts 21 to cause a vibration, thereby causing the sounding structures 2 to sound.

For example, in the embodiment where the display screen 1 and the first conductive parts 21 are flexible members and the second conductive parts 22 are inflexible members, voltage signals with any polarities are loaded on two first conductive layers 211 and two second conductive layers 221 provided respectively on both opposite surfaces of the display screen 1, such that when the polarities of voltage signals loaded on any one or any three of two first conductive layers 211 and two second conductive layers 221 are changed, the forces with the varying direction will be exerted on the flexible display screen 1 and first conductive parts 21 to cause a vibration, thereby causing the sounding structures 2 to sound.

For example, in the embodiment where the display screen 1 and the first conductive parts 21 are flexible members and the second conductive parts 22 are inflexible members, voltage signals with any polarities are loaded on two first conductive layers 211 and two second conductive layers 221 provided respectively on both opposite surfaces of the display screen 1, such that when the magnitudes of voltage signals loaded on any one, more than one or all of two first conductive layers 211 and two second conductive layers 221 are changed, the forces with the varying direction will be exerted on the flexible display screen 1 and first conductive parts 21 to cause a vibration, thereby causing the sounding structures 2 to sound.

The above ways for loading voltage signals are only illustrative, and may be made in any combination without deviating from the scope of the present disclosure.

In an embodiment of the present disclosure, as shown in FIGS. 1 and 2, a plurality of insulators 23 are included in the sounding structures 2, and are located at edges of the first conductive parts 21 and the second conductive parts 22 and/or located at the central region of the first conductive parts 21 and the second conductive parts 22. In an embodiment of the present disclosure, the insulators 23 may be flexible, for example, may be made of springs or any other elastic material; or the insulators 23 may be inflexible, for example, may be made of resin, PVC, metal or glass. The insulators 23 may be in any shape. In an embodiment of the present disclosure, a projection of each of the insulators 23 on the display screen 1 is small enough to reduce the adverse affection for display of the display screen 1 as much as possible.

It is noted that, the display screen 1 may be an OLED display screen of a bottom emitting type or a top emitting type, or may be a transparent OLED display screen, such as a transparent PMOLED (Passive Matrix OLED) or AMOLED (Active Matrix OLED) display screen. When the display screen 1 is the transparent OLED display screen, the insulators 23 are made of a transparent material, and the first bases 210, the first conductive layers 211, the second bases 220 and the second conductive layers 221 are also made of transparent materials, which reduce the adverse affection for the transparent display.

In an embodiment of the present disclosure, as shown in FIG. 1, the display apparatus further includes an outer frame 5 which encloses outer edges of the display screen 1 and the sounding structures 2, for fixing the display screen 1 and the sounding structures 2 and protecting the outer edges of the display screen 1 and the sounding structures 2. FIG. 2 does not show the outer frame 5.

FIGS. 3A to 3H each are schematic diagrams illustrating how to load voltage signals on the sounding structures in a display apparatus according to an embodiment of the present disclosure.

Figure 3A:
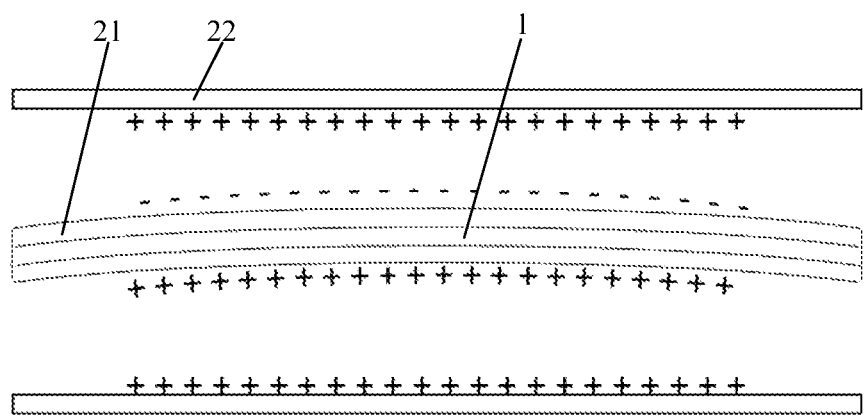
FIGS. 3A to 3H each are schematic diagrams illustrating how to load voltage signals on the sounding structure in the display apparatus according to an embodiment of the present disclosure.
Figure 3B:
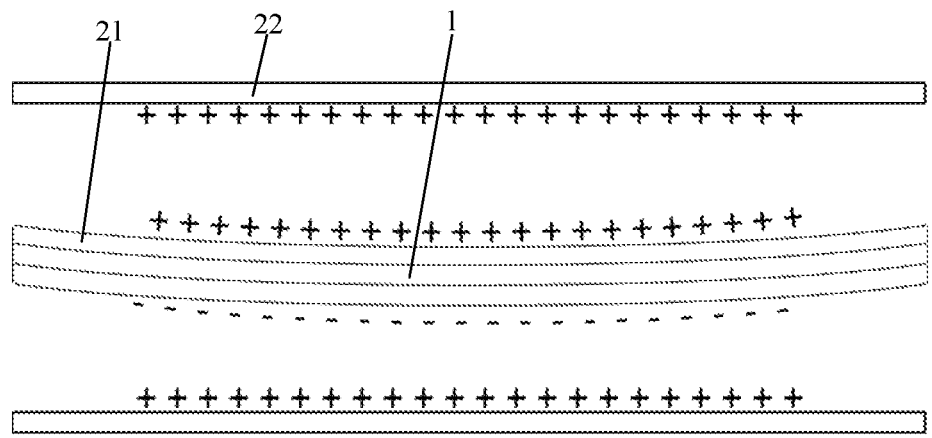

In an embodiment of the present disclosure, as shown in FIGS. 3A and 3B, the first conductive parts 21 are loaded with voltage signals with the varying polarity and the second conductive parts 22 are loaded with voltage signals with the fixed polarity. The polarity of voltage signals loaded on the first conductive parts 21 is changed as illustrated from FIG. 3A to FIG. 3B such that forces with the varying direction are produced and exerted on the first conductive parts 21 and the display screen 1, thereby causing the sounding structures 2 to sound.

Figure 3C:
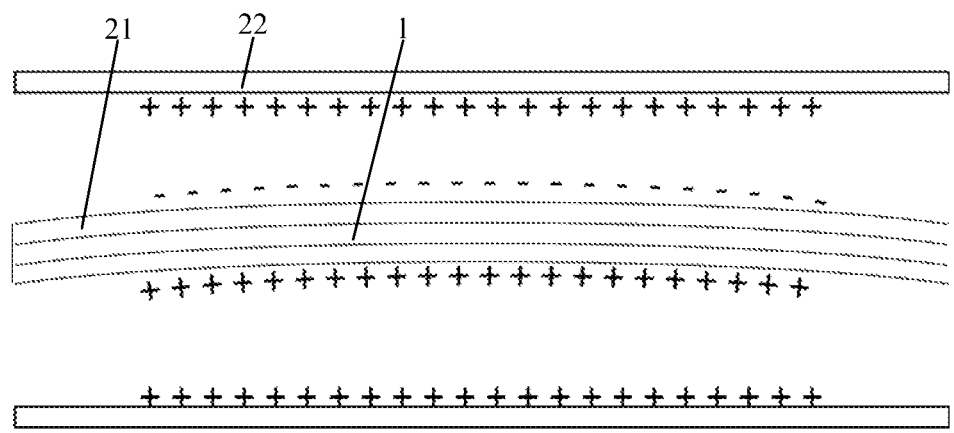
Figure 3D:
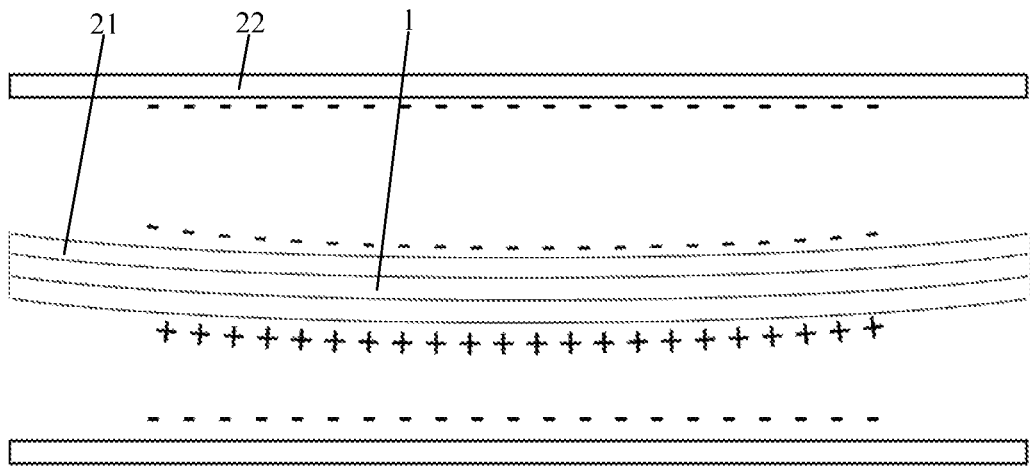

As shown in FIGS. 3C and 3D, the first conductive parts 21 are loaded with voltage signals with the fixed polarity and the second conductive parts 22 are loaded with voltage signals with the varying polarity. The polarity of voltage signals loaded on the second conductive parts 22 is changed as illustrated from FIG. 3C to FIG. 3D such that forces with the varying direction are produced and exerted on the first conductive parts 21 and the display screen 1, thereby causing the sounding structures 2 to sound.

In other embodiment of the present disclosure, except for loading voltage signals on the sounding structures 2 as shown in FIGS. 3A to 3D, other ways for loading voltage signals can be used, such that the sounding structures 2 are deformed to sound under the driving of the loaded voltage signals.

Figure 3E:
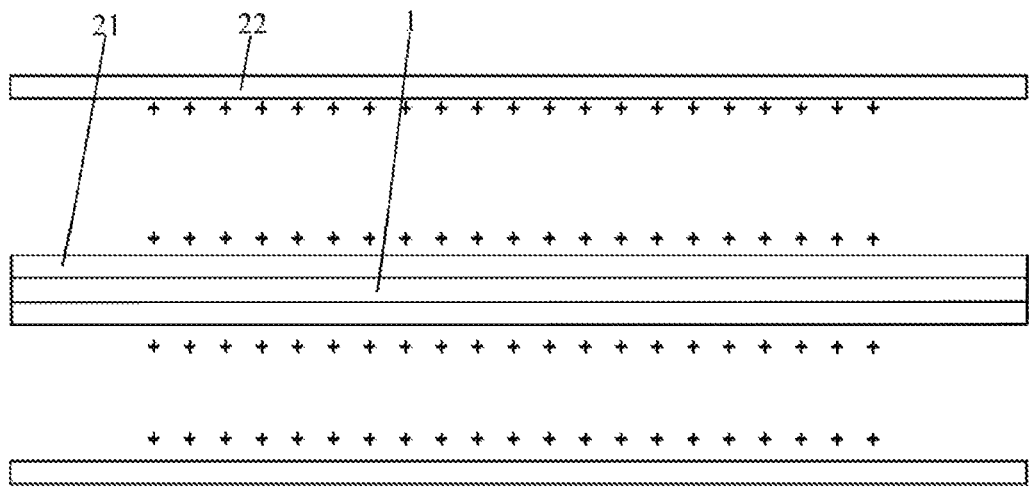
Figure 3F:
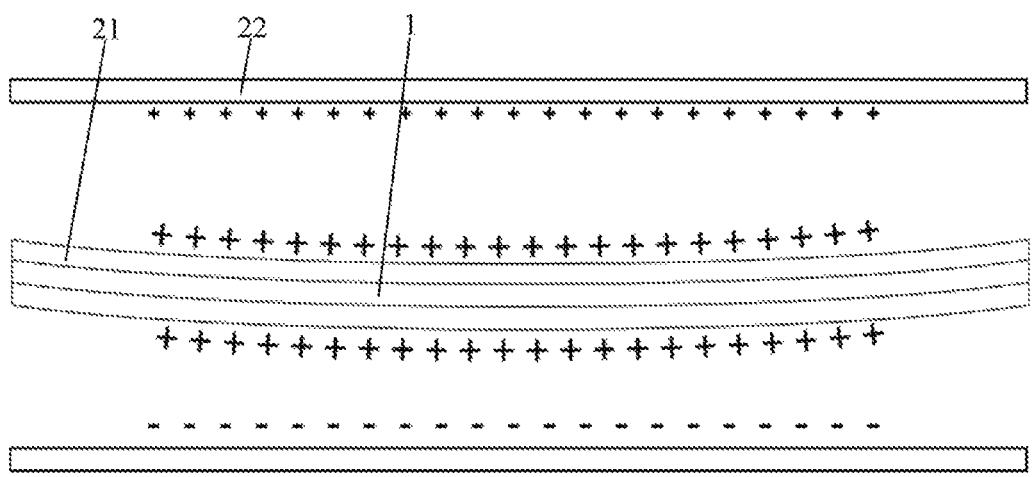

As shown in FIGS. 3E and 3F, the first conductive parts 21 and the second conductive parts 22 are first loaded with voltage signals with a same polarity as shown in FIG. 3E, the polarity of voltage signals loaded on one of the first conductive parts 21 and the second conductive parts 22 is then changed as shown in FIG. 3F such that forces with the varying direction are produced and exerted on the first conductive parts 21 and the display screen 1, thereby causing the sounding structures 2 to sound.

Figure 3G:
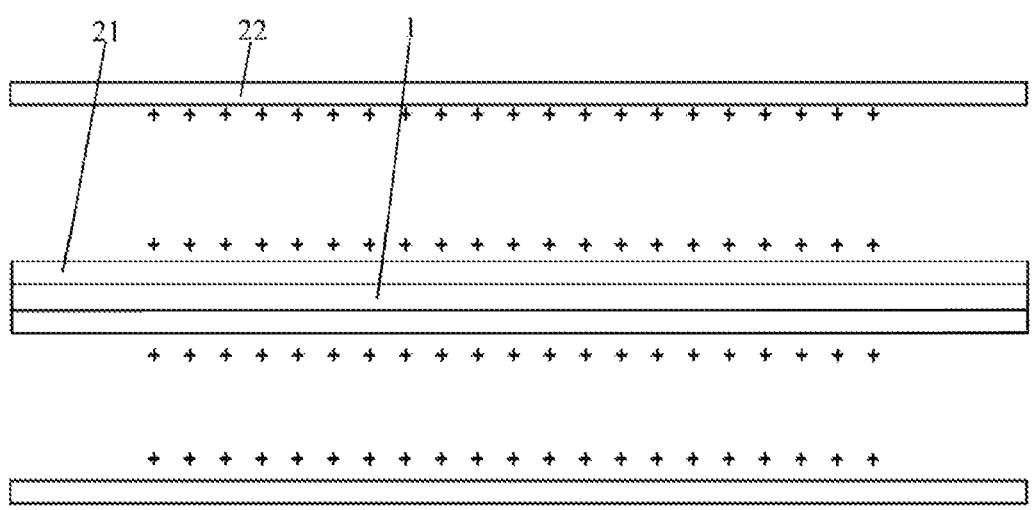
Figure 3H:
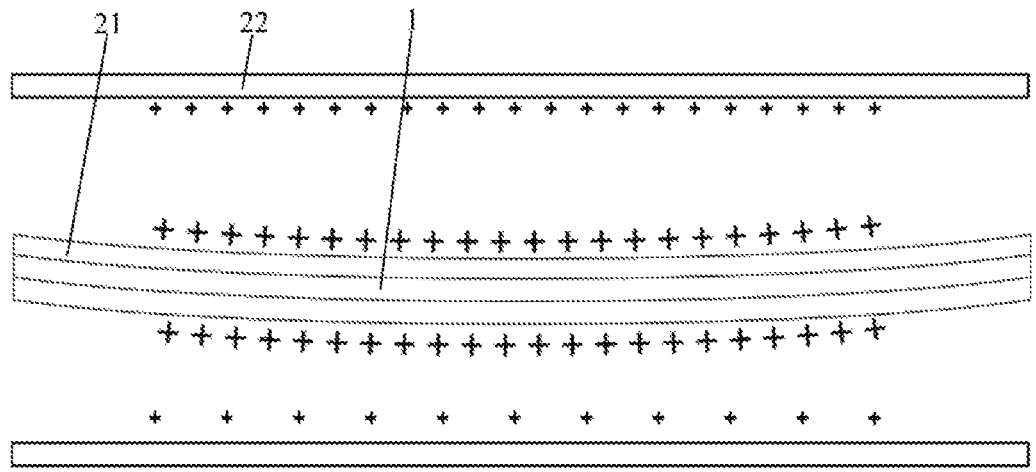

As shown in FIGS. 3G and 3H, the first conductive parts 21 and the second conductive parts 22 are first loaded with voltage signals with a same polarity, the magnitude of voltage signals loaded on one of the first conductive parts 21 and the second conductive parts 22 is then changed such that forces with the varying direction are produced and exerted on the first conductive parts 21 and the display screen 1, thereby causing the sounding structures 2 to sound. In FIG. 3H, voltage signals loaded on the bottom second conductive part 22 become small. In an embodiment of the present disclosure, as shown in FIGS. 3A to 3H, the first conductive parts 21 and the display screen 1 are flexible.

All of the above ways for loading voltage signals can cause the sounding structures 2 to sound.

Accordingly, in an embodiment of the present disclosure, the first conductive layers are loaded with voltage signals with the varying polarity and the second conductive layers are loaded with voltage signals with the fixed polarity.

In other embodiment of the present disclosure, the first conductive layers are loaded with voltage signals with the fixed polarity and the second conductive layers are loaded with voltage signals with the varying polarity.

In other embodiment of the present disclosure, other ways for loading voltage signals may be used, causing the sounding structures to sound.

An embodiment of the present disclosure provides a display apparatus, which is similar to that in the above embodiments except that the second conductive part is flexible and the first conductive part is inflexible, such that as the second conductive part produces a deformation under driving of sound signals, the second conductive part can produce vibration with respect to the first conductive part during the deformation, thereby causing the sounding structure to sound.

Accordingly, the thickness of the second conductive part is less than 1 mm, and the thickness of the second base of the second conductive part is less than 0.1 mm, and the thickness of the second conductive layer is less than 50 µm. The thickness of the first conductive part and the first conductive layer and the first base of the first conductive part is not limited.

The parameters such as the curvature radius of the flexible members are set and the distance between the first conductive part and the second conductive part is set, such that the sounding structure can sound with a better effect, thus improving the experience during a user watches the videos.

In an embodiment of the present disclosure, the display screen may be a LCD display screen.

Other structures and configuration of the display apparatus provided by the embodiment of the present disclosure are same as those in the embodiment as shown in FIGS. 1 and 2 and thus are not described for clarity.

In an embodiment of the present disclosure, as shown in FIG. 2, the voltage signals loaded on the first conductive layer 211 and the second conductive layer 221 provided on one surface of the display screen 1 are changed independent from the voltage signals loaded on the first conductive layer 211 and the second conductive layer 221 provided on the opposite surface of the display screen 1, without influence therebetween.

FIGS. 4A to 4D are schematic diagrams illustrating how to loading voltage signals on sounding structures in a display apparatus according to an embodiment of the present disclosure.

Figure 4A:
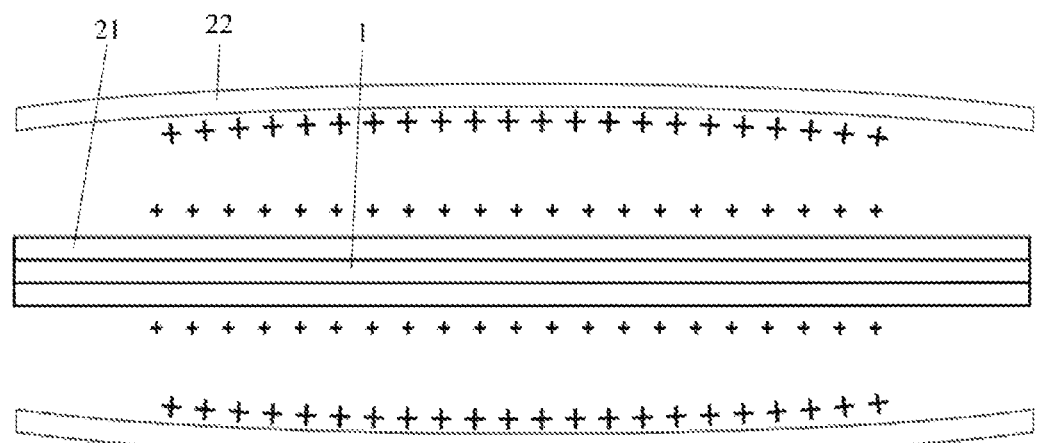
FIGS. 4A to 4D each are schematic diagrams illustrating how to load voltage signals on the sounding structure in the display apparatus according to an embodiment of the present disclosure.
Figure 4B:
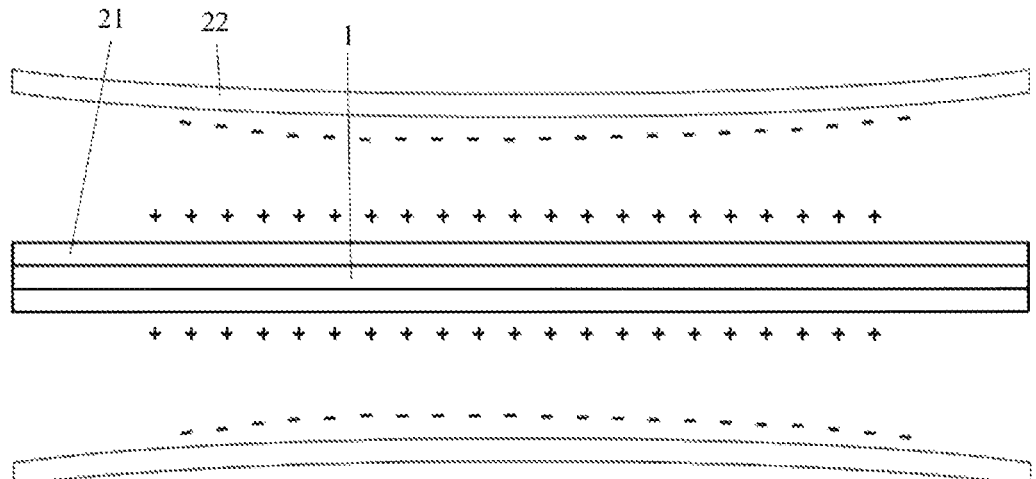

As shown in FIGS. 4A and 4B, the first conductive parts 21 and the second conductive parts 22 at both sides of the display screen 1 are first loaded with voltage signals with a same polarity as shown in FIG. 4A. The polarity of voltage signals loaded on one of the first conductive part 21 and the second conductive part 22 at any side is then changed as shown in FIG. 4B such that forces with the varying direction are produced and exerted on the second conductive parts 22, thereby causing the sounding structures 2 to sound.

Figure 4C:
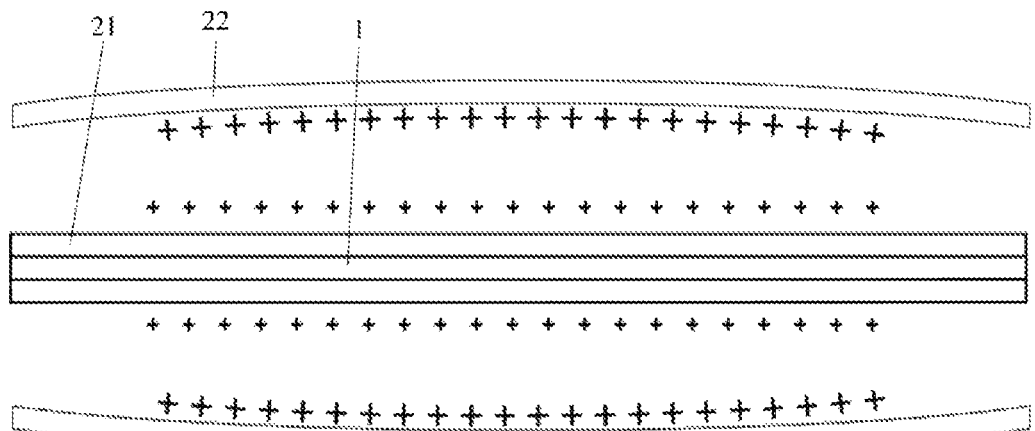
Figure 4D:
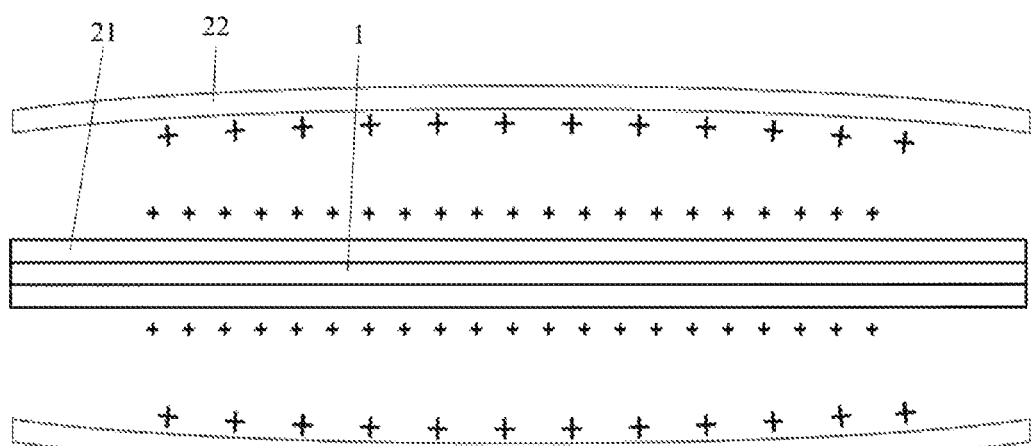

As shown in FIGS. 4C and 4D, the first conductive parts 21 and the second conductive parts 22 at both sides of the display screen 1 are first loaded with voltage signals with a same polarity as shown in FIG. 4C. The magnitude of voltage signals loaded on one of the first conductive part 21 and the second conductive part 22 at any side is then changed as shown in FIG. 4D such that forces with the varying direction are produced and exerted on the second conductive parts 22, thereby causing the sounding structures 2 to sound. In FIG. 4D, voltage signals loaded on the second conductive parts 22 become small.

In other embodiment of the present disclosure, other ways for loading voltage signals may be used to cause the sounding structures 2 to sound. The display apparatus provided by the embodiment of the present disclosure also causes the sounding structures to sound by providing the second conductive parts to be flexible, such that the display apparatus does not need to be provided with speakers, reducing the volume of the display apparatus and expanding its application field and improving its added values, while causing the display apparatus to be more unique and fashionable.

Another embodiment of the present disclosure provides a display apparatus, which is similar to that in the above embodiments except that the first conductive part is attached to the display screen and the first conductive part, the second conductive part and the display screen are flexible members; one of the first conductive part and the second conductive part is loaded with voltage signals with the varying polarity, and the other is loaded with voltage signals with the fixed polarity; the curvature radius of the flexible member loaded with voltage signals with the varying polarity is less than 0.5 cm; the curvature radius of the flexible member not loaded with voltage signals with the varying polarity is greater than 1 cm; and the distance between the first conductive part and the second conductive part is in the range of 10~20 mm.

The flexible members are deformed under the driving of the sound signals, causing the flexible members to vibrate and thereby to sound.

In the display apparatus provided by the embodiment of the present disclosure, the parameters such as the curvature radius and the distance are set, such that the at least one sounding structure can sound with a better effect, improving the experience during a user watches the videos. Other structures and configurations of the display apparatus provided by the embodiment of the present disclosure are the same as those in the above embodiments and thus are not described for clarity.

The display apparatus provided by the embodiment of the present disclosure also causes the sounding structure to sound by providing the first conductive part, the second conductive part and the display screen to be flexible, such that the display apparatus does not need to be provided with speakers, reducing the volume of the display apparatus and expanding its application field and improving its added values, while causing the display apparatus to be more unique and fashionable.

Figure 5:
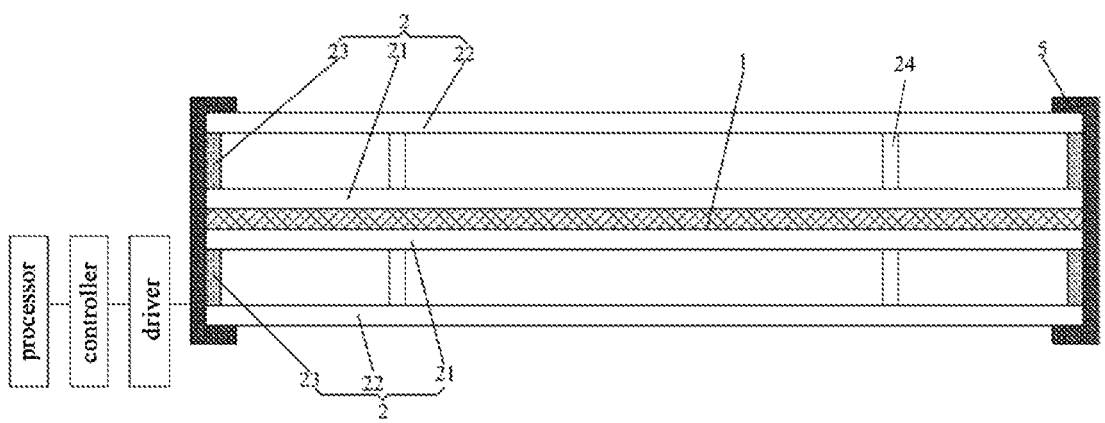
FIG. 5 is a schematic diagram of a structure of a display apparatus according to an embodiment of the present disclosure.
Figure 6:
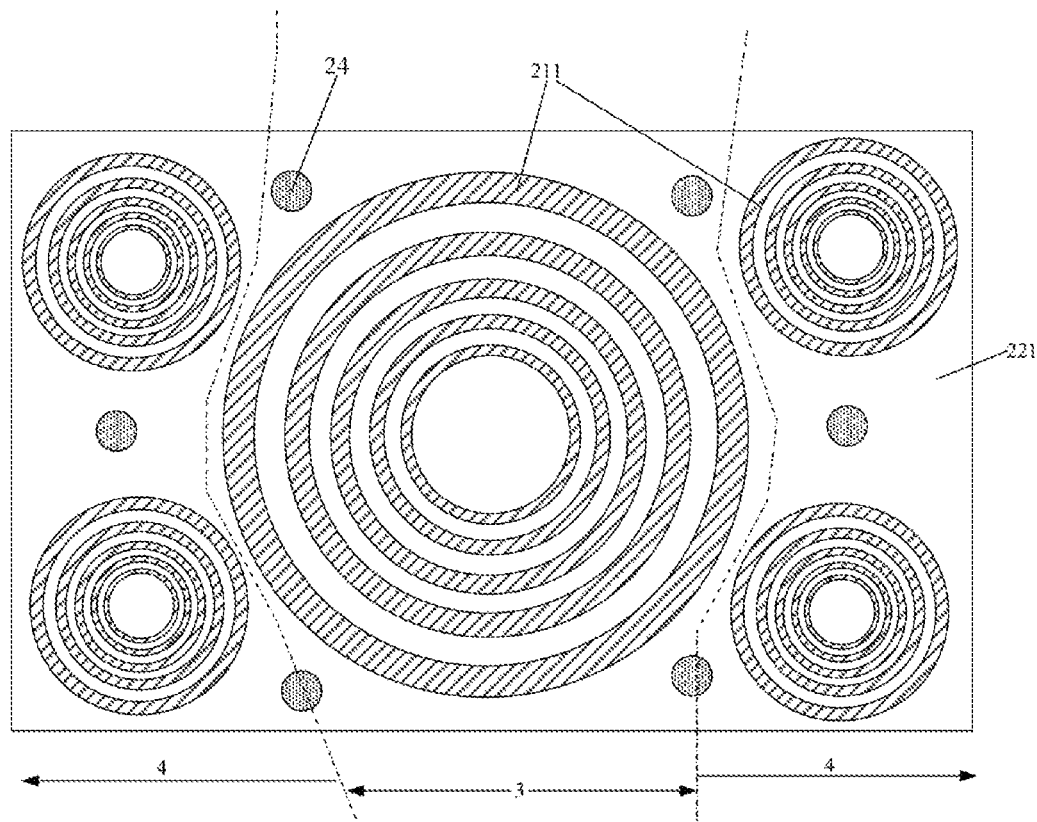
FIG. 6 is a perspective top view of a structure of a display apparatus according to an embodiment of the present disclosure.

FIG. 5 is a schematic diagram of a structure of a display apparatus according to an embodiment of the present disclosure; and FIG. 6 is a perspective top view of a structure of a display apparatus according to an embodiment of the present disclosure.

An embodiment of the present disclosure provides a display apparatus, which is similar to that in the above embodiments except that as shown in FIGS. 5 and 6, and the display apparatus further includes a plurality of separators 24 which are located at the central region of the first conductive parts and the second conductive parts. The separators 24 are made of an insulating rigid material, and are provided between the first conductive parts 21 and the second conductive parts 22 for supporting and connecting the first conductive parts and the second conductive parts, for fixing the first and second conductive parts together with the display screen and for dividing the first conductive layers 211 or the second conductive layers 221. In the embodiment where the display screen is transparent, the separators 24 may be made of a transparent material such as glass or PVC. In the embodiment where the display screen is non-transparent, the separators 24 may be made of a non-transparent material, such as resin or metal.

In an embodiment of the present disclosure, the first conductive layers are loaded with the sound signals and the second conductive layers are loaded with the fixed signals. The first conductive layers are divided into a conductive layer at a middle region and at least one edge conductive layer at edge regions by the plurality of separators 24, the middle region is at the middle of the first conductive layers and the edge regions are at the edges of the first conductive layers; or, the second conductive layers are loaded with the sound signals and the first conductive layers are loaded with the fixed signals. The second conductive layers are divided into a conductive layer at a middle region and at least one conductive layer at edge regions by the plurality of separators 24, the middle region is at the middle of the second conductive layers and the edge regions are at the edges of the second conductive layers.

Specifically, in an embodiment of the present disclosure, as shown in FIGS. 5 and 6, the plurality of separators 24 are distributed uniformly on the display screen, such that when one of the first conductive layer 211 or the second conductive layer 221 of each sounding structure 2 is loaded with voltage signals with the varying polarity, the first conductive layer 211 or the second conductive layer 221 loaded with voltage signals with the varying polarity is divided into a middle region 3 and edge regions 4 at both sides of the middle region 3, and the edge regions 4 are at the edges of the first conductive layer 211 or the second conductive layer 221. For example, as shown in FIG. 6, the edge regions 4 are at four corners. In FIG. 6, the dashed lines only schematically show the divided regions.

In an embodiment of the present disclosure, the conductive layer at the middle region includes a plurality of central conductive layers distributed in concentric rings, and two adjacent central conductive layers are separated and electrically insulated from each other. And each of the central conductive layers at the middle region is separately loaded with the sound signals.

Specifically, in an embodiment of the present disclosure, the conductive layer at the middle region 3 includes a plurality of central conductive layers distributed in concentric rings. In other embodiment of the present disclosure, the conductive layer at each of the edge regions 4 includes a plurality of edge conductive layers distributed in concentric rings. In an embodiment of the present disclosure, when the first conductive layer 211 is loaded with voltage signals with the varying polarity, the first conductive layer 211 is divided into the conductive layer at the middle region 3 and the conductive layers at edge regions 4, while the second conductive layer 221 is not divided but as a whole layer. The conductive layer at the middle region 3 and the conductive layer at each of the edge regions 4 of the first conductive layer 211 include the plurality of conductive layers distributed in concentric rings.

The difference between the display apparatus provided by the embodiment of the present disclosure and the display apparatus in the above embodiments lies in: the first conductive layers 211 and the second conductive layers 221 in the display apparatus in the above embodiments are of whole layers, and for the first conductive layer 211 and the second conductive layer 221 of each sounding structure 2 in the display apparatus provided by the embodiment of the present disclosure, one is divided into central conductive layers at the middle region 3 distributed in concentric rings and edge conductive layers at the edge regions 4 at both sides of the middle region 3 when loaded with voltage signals with the varying polarity, and the other is the whole layer. For example, if the first conductive layer 211 is loaded with voltage signals with the varying polarity, the first conductive layer 211 is divided into a plurality of central conductive layers distributed in concentric rings at the middle region 3 and a plurality of edge conductive layers at the edge regions 4 at both sides of the middle region 3, and the second conductive layer 221 is the whole layer. All concentric conductive layers at the middle region 3 and all the edge conductive layers at the edge regions 4 are all connected with the driver via the respective signal lines, such that voltage signals are applied to them by the driver, separately.

The first conductive layers 211 loaded with voltage signals with the varying polarity are provided as central conductive layers distributed in concentric rings at the middle region 3 and edge conductive layers distributed in concentric rings at each of the edge regions 4, such that the sound from the sounding structures 2 has a more stereo sound field and thus is more stereo, which causes a listener to be more immersive when listening to the sound.

In an embodiment of the present disclosure, as shown in FIG. 6, for the first or second conductive layer, there is one middle region 3 and four edge regions 4. In an embodiment of the present disclosure, more than four edge regions 4 may be provided. In other embodiment of the present disclosure, 6, 8 or more edge regions 4 may be provided. The diameter of the outermost concentric ring at the middle region 3 is at least twice greater than that of the outermost concentric ring at each of the edge regions 4. In an embodiment of the present disclosure, other numbers and shapes of separators 24 may be included, for dividing the first conductive layers 211 or the second conductive layers 221. In an embodiment of the present disclosure, main sound signals may be applied to the middle region 3, and signals in left and right channels may be applied to the edge regions 4. In this way, the sound from the sounding structures is more stereo, a listener is caused to be more immersive when listening to the sound, which improves the sounding effect of the sounding structure.

Other structures and configurations of the display apparatus provided by the embodiment of the present disclosure are the same as those in the above embodiments and thus are not described for clarity.

On the basis of the above structures of the display apparatus provided by the embodiment of the present disclosure, the difference between the driving method of the display apparatus provided by the embodiment of the present disclosure and the driving method of the display apparatus in the above embodiments lies in: the central conductive layers at the middle region 3 are loaded with voltage signals with the varying polarity and the original magnitudes, and the edge conductive layers at the edge regions 4 are loaded with voltage signals with the varying polarity and the adjusted magnitudes; the polarity of sound signals is changed such that the forces with the varying direction are produced and exerted on the corresponding conductive parts, thereby causing the sounding structures 2 to sound. In this way, the sound from the sounding structures is more stereo.

In an embodiment of the present disclosure, for the first conductive layers 211, the central conductive layers at the middle region 3 are loaded with voltage signals with the varying polarity and the original magnitudes, and the edge conductive layers at the edge regions 4 are loaded with voltage signals with the varying polarity and the adjusted magnitudes. The second conductive layers 221 are loaded with voltage signals with the fixed polarity.

For example, when the display screen is displaying the videos and a person who is speaking is at the left of the display screen, the processor performs an intelligent identification for the sound from the videos, and thus generates and sends corresponding signals to the controller, such that the controller controls the driver to load voltage signals, for causing the sounding structures to sound, on the sounding structures 2 according to the received signals.

Specifically, in an embodiment of the present disclosure, the edge regions 4 at the left of the first conductive layers 211 receive voltage signals with the varying polarity after boosted by the driver, the edge regions 4 at the right of the first conductive layers 211 do not receive voltage signals or do receive voltage signals with the varying polarity and the reduced magnitudes by the driver, but the central conductive layers at the middle region 3 of the first conductive layers 211 are loaded with voltage signals with the varying polarity and the original magnitudes provided by the driver. The polarity of sound signals is changed such that the forces with the varying direction are produced and exerted on the corresponding conductive parts, thereby causing the sounding structures 2 to sound. In this way, the listener feels that the source of sounds is at the position in the display screen where the person is in place, causing sounds to be more stereo and be more immersive.

In an embodiment of the present disclosure, the central conductive layers distributed in concentric rings at the middle region 3, from the ring with a minimum diameter to the ring with a maximum diameter, are successively loaded with voltage signals with the varying polarity by a predetermined delay time. The polarity of sound signals is changed such that the forces with the varying direction are produced and exerted on the corresponding conductive parts, thereby causing the sounding structures 2 to sound. In this way, the sound is made like the spherical diffusion of sound waves from an original sound source, which further causes the sound to be more stereo and further improves the listening experience for the listener.

In an embodiment of the present disclosure, the predetermined delay time is less than 100 ms. It is noted that it is also possible to set a varying predetermined delay time when the concentric rings from the ring with the minimum diameter to the ring with the maximum diameter are successively loaded with voltage signals with the varying polarity. For example, from the ring with the minimum diameter to the ring with the maximum diameter, the predetermined delay time may be made to be shorter or longer. In short, if only the sounding effect can be improved, the predetermined delay time and the magnitudes of the adjusted voltage signals with the varying polarity may be set, and are not limited herein.

Other ways for loading voltage signals in the display apparatus provided by the embodiment of the present disclosure are the same as those in the above embodiments and thus are not described for clarity.

Figure 7:
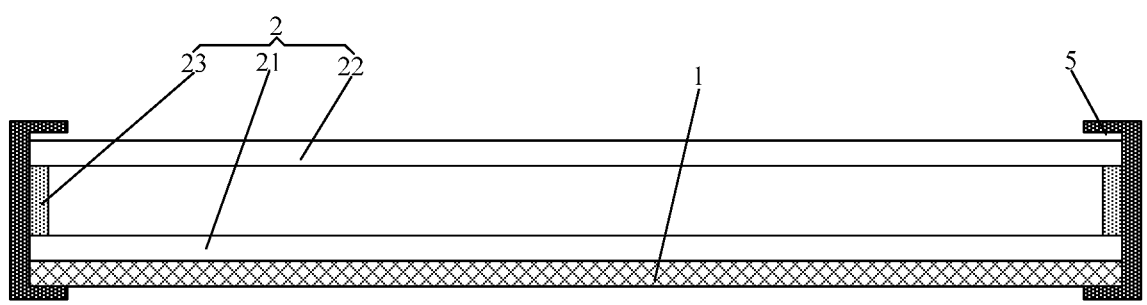
FIG. 7 is a schematic diagram of a structure of a display apparatus according to an embodiment of the present disclosure.

FIG. 7 is a schematic diagram of a structure of a display apparatus according to an embodiment of the present disclosure.

The embodiment of the present disclosure provides a display apparatus which is similar to that in the above embodiments except that as shown in FIG. 7, the sounding structure 2 is provided at one side of both opposite surfaces of the display screen 1. In an embodiment of the present disclosure, the sounding structure 2 is provided at the display side of the display screen 1.

It is noted that the sounding structure 2 provided at the display side of the display screen 1 is necessarily made of transparent materials, which prevents the sounding structure 2 from adversely affecting the normal display of the display screen 1.

In addition, the sounding structure 2 may be provided at a side of the display screen 1 distal to the display side.

Other structures and other configurations of the sounding structure 2 and the driving method of the display apparatus provided by the embodiment of the present disclosure are the same as those in the above embodiment and thus are not described for clarity.

The advantage effects of the embodiment of the present disclosure are: for the display apparatus provided by the embodiment of the present disclosure, the sounding structure is provided at at least one side of both opposite surfaces of the display screen, such that the display apparatus can sound from the display screen in the case where the sounding structure is deformed to sound under the driving of the sound signals, such that the display apparatus does not need to be provided with speakers, reducing the volume of the display apparatus and expanding its application field and improving its added values, while causing the display apparatus to be more unique and fashionable.

The display apparatus provided by the embodiment of the present disclosure can be any product or component having a function of display such as an OLED panel, an OLED TV, a LCD panel, a LCD TV, a display, a mobile phone, and a navigator.

The display apparatus of the present disclosure is not limited to that described in the above embodiments, and further includes other embodiments implementing the display apparatus. All of forms implementing the display apparatus fall in the scope of the present disclosure without deviating from the spirit and the scope of the present disclosure. It should be understood that the above embodiments are merely exemplary embodiments used only for illustrating the principle of the present disclosure. However, the present disclosure is not limited thereto. Obviously, those skilled in the art can make various modifications and variants to this disclosure without departing from spirit and scope of this disclosure. As such, if these modifications and variants of this disclosure fall into the scope of the claims and their equivalents, the present disclosure intends to include these modifications and variants.

What is claimed is:

1. A display apparatus, comprising a display screen with two opposite surfaces, at least one of the two opposite surfaces being a display surface, wherein
a sounding structure is arranged on at least one side of the two opposite surfaces of the display screen, the sounding structure is configured to be deformed to sound under driving of sound signals, and the sound signals are electric signals applied to the sounding structure according to sounds to be made,
wherein the sounding structure comprises a first conductive part and a second conductive part which are provided opposite to each other; the second conductive part is provided at a side of the first conductive part distal to the display screen; the first conductive part and the second conductive part are separated from each other, and supported and connected by at least one insulator;
at least one of the first conductive part and the second conductive part is a flexible member;
the sound signals are applied to the first conductive part of the second conductive part; and
the display apparatus further includes an outer frame which encloses outer edges of the display screen and outer edges of the first conductive part and the second conductive part of the sounding structure, for fixing the display screen and the sounding structure and protecting the outer edges of the display screen and the sounding structure.

2. The display apparatus of claim 1, wherein the at least one insulator comprises a plurality of insulators, which are located at edges of the first conductive part and the second conductive part; and/or located at a central region of the first conductive part and the second conductive part.

3. The display apparatus of claim 2, wherein the insulator is made of an elastic material.

4. The display apparatus of claim 1, wherein the first conductive part is attached to the display screen, and the first conductive part and the display screen are both flexible members; or the second conductive part is a flexible member;
the flexible member has a curvature radius less than 1 cm, and a distance between the first conductive part and the second conductive part is in the range of 1~20 mm, and
one of the first conductive part and the second conductive part is loaded with the sound signals, and the other is loaded with fixed signals.

5. The display apparatus of claim 4, wherein the sound signals are voltage signals with a varying polarity; and the fixed signals are voltage signals with a fixed polarity.

6. The display apparatus of claim 1, wherein the first conductive part is attached to the display screen, and the first conductive part, the display screen and the second conductive part are flexible members;
one of the first conductive part and the second conductive part is loaded with the sound signals, the other is loaded with fixed signals; the flexible member loaded with the sound signals has a curvature radius less than 0.5 cm; the flexible member loaded with fixed signals has a curvature radius greater than 1 cm; and a distance between the first conductive part and the second conductive part is in the range of 10~20 mm.

7. The display apparatus of claim 6, wherein the sound signals are voltage signals with a varying polarity; and the fixed signals are voltage signals with a fixed polarity.

8. The display apparatus of claim 5, wherein the first conductive part comprises a first base and a first conductive layer stacked on each other, and the first base is attached to the display screen;
the second conductive part comprises a second base and a second conductive layer stacked on each other, and the second conductive layer faces the first conductive layer; and
signals loaded on the first conductive part are loaded on the first conductive layer; and signals loaded on the second conductive part are loaded on the second conductive layer.

9. The display apparatus of claim 8, wherein the first conductive layer is loaded with the sound signals and the second conductive layer is loaded with the fixed signals, the first conductive layer has a resistance greater than 500 MΩ, and the first conductive layer has a thickness less than 50 μm, and the first base has a thickness less than 0.1 mm, or
the second conductive layer is loaded with the sound signals and the first conductive layer is loaded with the fixed signals, the second conductive layer has a resistance greater than 500 MΩ, and the second conductive layer has a thickness less than 50 μm, and the second base has a thickness less than 0.1 mm.

10. The display apparatus of claim 9, further comprising: a plurality of separators which are located between the first conductive part and the second conductive part and are configured to support and connect the first conductive part and the second conductive part,
wherein the first conductive layer is loaded with the sound signals and the second conductive layer is loaded with the fixed signals, the first conductive layer is divided into a conductive layer at a middle region and at least one conductive layer at an edge region by the plurality of separators, or
the second conductive layer is loaded with the sound signals and the first conductive layer is loaded with the fixed signals, the second conductive layer is divided into a conductive layer at a middle region and at least one conductive layer at an edge region by the plurality of separators.

11. The display apparatus of claim 10, wherein the conductive layer at the middle region comprises a plurality of central conductive layers distributed in concentric rings, and two adjacent central conductive layers of the plurality of central conductive layers are separated and electrically insulated from each other; and
each of the central conductive layers at the middle region is separately loaded with the sound signals.

12. The display apparatus of claim 11, wherein the at least one conductive layer at the edge region comprises a plurality of edge conductive layers distributed in concentric rings, and two adjacent edge conductive layers of the plurality of edge conductive layers are separated and electrically insulated from each other; and each of the edge conductive layers at the edge region is separately loaded with the sound signals,
a diameter of an outermost concentric ring of the plurality of central conductive layers is at least twice greater than that of an outermost concentric ring of the plurality of edge conductive layers.

13. The display apparatus of claim 5, wherein two sounding structures are respectively arranged at both sides of the two opposite surfaces of the display screen; a first surface of the two opposite surfaces is provided with a first sounding structure, a second surface of the two opposite surfaces is provided with a second sounding structure, the first conductive parts of the first sounding structure and the second sounding structure and the display screen are flexible members, and the second conductive parts of the first sounding structure and the second sounding structure are inflexible members, the display apparatus further comprises:

a driver configured to load the sound signals or the fixed signals on the first conductive parts and the second conductive parts via separated wires, wherein the polarity of voltage signals loaded on one of two first conductive parts and two second conductive parts of the first sounding structure and the second sounding structure is opposite to that of voltage signals loaded on the other three of the two first conductive parts and the two second conductive parts of the first sounding structure and the second sounding structure;

a controller configured to control the driver; and a processor configured to produce and send signals, corresponding to the sound that the display screen is intended to make, to the controller such that the controller controls the driver to change the polarity of the sound signals according to the received signals;

wherein the processor is further configured to produce and send signals, corresponding to a case that the display screen does not make a sound, to the controller such that the controller controls the driver not to load the voltage signals on the first conductive parts and the second conductive parts according to the received signals.

14. The display apparatus of claim 4, wherein two sounding structures are respectively arranged at both sides of the two opposite surfaces of the display screen; a first surface of the two opposite surfaces is provided with a first sounding structure, a second surface of the two opposite surfaces is provided with a second sounding structure, the first conductive parts of the first sounding structure and the second sounding structure and the display screen are flexible members, and the second conductive parts of the first sounding structure and the second sounding structure are inflexible members, the display apparatus further comprises:

a driver configured to load the voltage signals on the first conductive parts and the second conductive parts via separated wires, a controller configured to control the driver; and a processor configured to produce and send signals, corresponding to the sound that the display screen is intended to make, to the controller such that the controller controls the driver to change the polarities of voltage signals loaded on one or three of two first conductive parts and two second conductive parts of the first sounding structure and the second sounding structure according to the received signals;

wherein the processor is further configured to produce and send signals, corresponding to a case that the display screen does not make a sound, to the controller such that the controller controls the driver not to load the voltage signals on the first conductive parts and the second conductive parts according to the received signals.

15. The display apparatus of claim 4, wherein two sounding structures are respectively arranged at both sides of the two opposite surfaces of the display screen; the first conductive parts of the two sounding structures and the display screen are flexible members, and the second conductive parts are inflexible members, the display apparatus further comprises:

a driver configured to load the voltage signals on the first conductive parts and the second conductive parts via separated wires, a controller configured to control the driver; and a processor configured to produce and send signals, corresponding to the sound that the display screen is intended to make, to the controller such that the controller controls the driver to change magnitudes of the voltage signals loaded on any one, more than one or all of two first conductive parts and two second conductive parts according to the received signals;

wherein the processor is further configured to produce and send signals corresponding to a case that the display screen does not make a sound, to the controller such that the controller controls the driver not to load the voltage signals on the first conductive parts and the second conductive parts according to the received signals.

16. The display apparatus of claim 9, wherein the second conductive part is a flexible member, the display apparatus further comprises:

a driver configured to load the sound signals or the fixed signals on the first conductive part and the second conductive part via separated wires, a controller configured to control the driver; and a processor configured to produce and send signals, corresponding to the sound that the display screen is intended to make, to the controller such that the controller controls the driver to change the polarities of the sound signals loaded on the first conductive part or the second conductive part according to the received signals;

wherein the processor is further configured to produce and send signals, corresponding to a case that the display screen does not make a sound, to the controller such that the controller controls the driver not to load the voltage signals on the first conductive part and the second conductive part according to the received signals.

17. The display apparatus of claim 4, wherein the second conductive part is a flexible member, the display apparatus further comprises:

a driver configured to load the voltage signals on the first conductive part and the second conductive part via separated wires, a controller configured to control the driver; and a processor configured to produce and send signals, corresponding the sound that the display screen is intended to make, to the controller such that the controller controls the driver to change magnitudes of the voltage signals loaded on the first conductive part or the second conductive part according to the received signals;

wherein the processor is further configured to produce and send signals, corresponding to a case that the display screen does not make a sound, to the controller such that the controller controls the driver not to load the voltage signals on the first conductive part and the second conductive part according to the received signals.

18. The display apparatus of claim 10, further comprising:
a driver configured to load the sound signals with original magnitudes on the conductive layer at the middle region, load the sound signals with adjusted magnitudes on the at least one conductive layer at the edge region and load the fixed signals on conductive part loaded with the fixed signals via separated wires;
a controller configured to control the driver; and
a processor configured to produce and send signals, corresponding to the sound that the display screen is intended to make, to the controller such that the controller controls the driver to change the polarities of the sound signals according to the received signals;
wherein the processor is further configured to produce and send signals, corresponding to a case that the display screen does not make a sound, to the controller such that the controller controls the driver not to load the voltage signals on the first conductive parts and the second conductive parts according to the received signals.

19. The display apparatus of claim 11, further comprising:
a driver configured to successively load the sound signals on the central conductive layers distributed in concentric rings at the middle region, from a ring with a minimum diameter to a ring with a maximum diameter, by a predetermined delay time, load the sound signals on the at least one conductive layer at the edge region and load the fixed signals on conductive parts loaded with the fixed signals, via separated wires;
a controller configured to control the driver; and
a processor configured to produce and send signals, corresponding to the sound that the display screen is intended to make, to the controller such that the controller controls the driver to change the polarities of the sound signals according to the received signals;
wherein the processor is further configured to produce and send signals, corresponding to a case that the display screen does not make a sound, to the controller such that the controller controls the driver not to load the voltage signals on the first conductive parts and the second conductive parts according to the received signals.

* * * * *